United States Patent [19]

Freygang

[11] 4,213,083
[45] Jul. 15, 1980

[54] CIRCUIT ARRANGEMENT FOR COMPENSATING TRANSMISSION ERRORS OF A TRANSFORMER

[75] Inventor: Hanz-Joachim Freygang, Berlin, Fed. Rep. of Germany

[73] Assignee: Siemens Aktiengesellschaft, Munich, Fed. Rep. of Germany

[21] Appl. No.: 828,422

[22] Filed: Aug. 29, 1977

[30] Foreign Application Priority Data

Sep. 13, 1976 [DE] Fed. Rep. of Germany ....... 2641581

[51] Int. Cl.² ............................................ H01F 40/14
[52] U.S. Cl. ................................... 323/44 R; 324/127
[58] Field of Search ..................... 323/6, 44 R, 48, 62; 324/117 R, 127

[56] References Cited

U.S. PATENT DOCUMENTS

| | | | |
|---|---|---|---|
| 2,644,128 | 6/1953 | Henrich | 323/48 X |
| 3,119,934 | 1/1964 | Lee | 323/48 X |
| 3,916,310 | 10/1975 | Stark et al. | 323/6 X |

*Primary Examiner*—A. D. Pellinen
*Attorney, Agent, or Firm*—Kenyon & Kenyon

[57] ABSTRACT

A circuit arrangement for compensating for the transmission errors introduced into a desired signal by passage of the signal through a transformer arrangement. The circuit arrangement comprises a phase-shift which is responsive to the output of the secondary of the transformer and which generates a compensating signal whose phase and amplitude are adjusted such that the compensating signal when combined with the desired signal and passed therewith through the transformer substantially cancels the errors in the desired signal resulting from the transformer. The circuit arrangement is further provided with a summer for combining the desired and compensation signals prior to application of the former signal to the transformer.

8 Claims, 4 Drawing Figures

CIRCUIT ARRANGEMENT FOR COMPENSATING TRANSMISSION ERRORS OF A TRANSFORMER

BACKGROUND OF THE INVENTION

1. Background of the Invention

The invention relates to a circuit arrangement for compensating for the transmission errors introduced into a desired signal by passage of the signal through a transformer.

2. Field of the Invention

In transformers, for example, the output transformers of power amplifiers, transmission errors occur frequently, particularly, at higher load currents. These errors are due in substance to phase angle errors between the phase of the input voltage and the output voltage.

It is an object of the present invention to provide a circuit arrangement for substantially compensating for the aforesaid transmission errors of transformers.

SUMMARY OF THE INVENTION

In accordance with the principles of the present invention, the above and other objectives are realized in a circuit arrangement which is provided with a phase shift means which is responsive to the output of the secondary of a transformer and which generates a compensating signal whose phase and ampliture are adjusted such that the compensating signal when combined with a desired signal and passed therewith through the transformer will substantially cancel the errors in the desired signal resulting from the transformer. The circuit arrangement is further provided with a combining means for combining the desired signal and compensating signal prior to application to the transformer.

In the embodiment of the invention to be disclosed hereafter, the phase shift means comprises a phase shifter having an adjustable phase shift and, if desired, an adjustable output to input amplitude ratio. The combining means, in turn, comprises a summing circuit having a summing point to which the desired and compensating signals are applied and summed. At the summing point, the compensating signal thus has an amplitude with respect to the desired signal which will result in substantial cancellation of the errors in the desired signal resulting from passage through the transformer. In particular, when added to the desired signal at the summing point, the compensating signal modifies the phase and the amplitude of the desired signal so that the subsequent modification of this signal by passage through the transformer results in the desired signal as it was prior to combining it with the compensating signal and, hence, the signal which would be obtained with error-free transmission through the transformer.

Adjustment of the compensating signal provided in the present circuit arrangement can be realized in a number of ways. In particular, such signal can be varied by employing variable resistors which adjustably weight the signal components forming the signal. Alternatively, the phase shifter can be designed to have a variable input to output voltage ratio.

The circuit arrangement of the present invention is preferably employed in circuits in which the primary winding of the transformer is connected to the output of a power amplifier. In such case, the summing circuit of the arrangement is arranged to precede the power amplifier or to include the latter as the summing amplifier.

The circuit arrangement of the present invention can be designed to compensate for transmission errors which occur with the transformer secondary open, i.e., with no load on the transformer, or with the secondary attached to a load. In the latter case, a signal which is derived from the current through the load impedance is, preferably, fed to the phase shifter. This signal is in phase with the current through the load impedance and has an amplitude which is proportional to the current amplitude. Preferably, the signal may be derived from the voltage across a current measuring resistor connected in series with the load impedance. The derived signal is then fed to a phase shifter comprising two amplifiers each of which may have an adjustable gain. The first amplifier has a purely ohmic operation, i.e., it changes only the amplitude of the signal fed to it, but not the phase. The second amplifier, on the other hand, shifts the phase of the signal fed to it by 90° C. The outputs of the two amplifiers are then connected to the inputs of the summing circuit either directly or via isolation amplifiers.

In the case of an open circuited transformer secondary a further phase shifting member of the phase shifter is coupled to the secondary winding of the transformer or to the tap of a voltage divider connected to the secondary winding of the transformer and its output is connected to a further input of the summing circuit.

BRIEF DESCRIPTION OF THE DRAWINGS

The above and other features and aspects of the present invention will become more apparent upon reading the following detailed description in conjunction with the attached drawings, in which.

DETAILED DESCRIPTION

Figure 1:
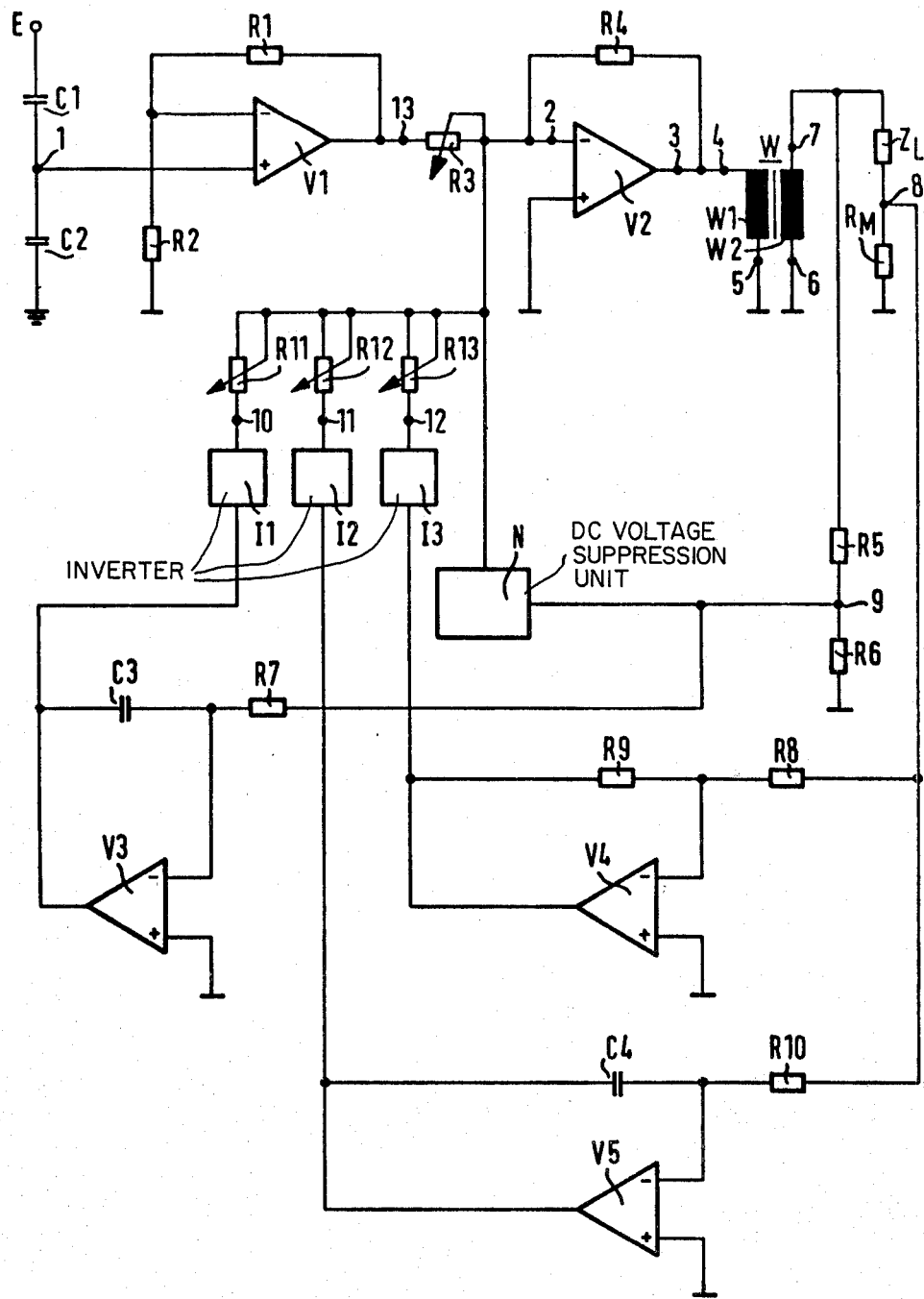
FIG. 1 shows a circuit arrangement in accordance with the principles of the present invention

FIG. 1 shows a circuit arrangement in accordance with the principles of the present invention. The arrangement is provided with an input terminal E, to which a capacitive voltage divider comprising two capacitors C1 and C2 is connected and to which a desired ac voltage, which may be a high-voltage and which is required to be measured, is applied. Tap 1 of the voltage divider C1, C2 is connected to the non-inverting iput of a preamplifier V1, the latter preamplifier being provided with negative feedback via the ohmic resistors R1 and R2.

The output voltage of the preamplifier V1 is coupled to an input 13 of a summing circuit comprised of variable resistors R3, R11, R12 and R13. In particular, via the resistor R3, the preamplifier output voltage is coupled to the inverting input 2 of a power amplifier V2 whose output 3 is likewise coupled to its inverting input 2 by a negative-feedback resistor R4. The gain of the power amplifier seen by the preamplifier output voltage is thus determined by the ratio of the resistance of the feedback resistor R4 to that of the series resistor R3 and, hence, can be adjusted by means of the resistor R3.

The output voltage of the amplifier V2 is also a function of the voltages which are fed to the inputs 10, 11, 12 of the summing circuit, as well as by the settings of the summing resistors R11, R12, R13 through which such voltages are coupled from such inputs to the inverting amplifier inputs 2. The latter resistors weight their respective voltages for the summation, since the gain of the amplifier V2 seen by such voltages is determined by the ratio of the resistor R4 to the resistors R11, R12, R13, respectively. The output voltage of the amplifier V2 at the output 3 thereof is, thus, proportional to the sum of the voltages fed to the inputs 13, 10, 11 and 12, referred to the amplifier input 2, i.e., the summing point of the summing circuit.

The output 3 of the amplifier V2 is connected to a first terminal 4 of the primary winding W1 of a transformer W, the second terminal 5 of which is connected to ground. The secondary winding W2 of the transformer also has one terminal 6 grounded. The other terminal 7 of the secondary winding W2 is connected to a series circuit comprising a load impedance $Z_L$ and a current measuring resistor $R_M$.

Due to the fact that the above-described components are not ideal, the desired ac voltage as it appears at the preamplifier output will arrive at the output terminal 7 of the secondary winding W2 with an amplitude and phase error. These errors can be compensated for or cancelled by providing suitable signals to one or more of the inputs 10, 11, 12 of the summing circuit and by providing suitable adjustment of one or more of the resistors R3, R11, R12 and R13.

In particular, in the case of the transformer secondary being in an open circuit condition, i.e., with no load impedance connected to the secondary, the amplitude error of the desired ac voltage can be cancelled by adjusting the resistor R3. The phase error of such voltage, on the other hand, can be cancelled via the resistor R11, and an appropriately derived signal applied to the input 10 of the summing circuit. For generating the latter signal, a voltage divider comprising the resistors R5 and R6 is connected to the terminal 7 of the secondary winding W2. The tap 9 of the voltage divider is connected via a resistor R7 to the inverting input of an amplifier V3, the latter amplifier being provided with negative feedback via the capacitor C3. The amplifier V3 thus operates as an integrator and shifts the phase of the voltage fed to it by 90°. The phase shifted output voltage of the amplifier V3 is coupled to an inverter I1 whose output is applied to the input 10 of the summing circuit and comprises a voltage which is phase shifted by +90° or −90° relative to the voltage which appears at the terminal 7 of the secondary winding W2 and, therefore, at the input 2 of the power amplifier V2. By appropriate adjustment of the resistor R11, the aforesaid voltage is coupled to the summing point 2 with such an amplitude that the phase error occurring in the desired ac voltage at the terminal 7 is cancelled.

It should be noted that, in some cases, the inverter I1 can be dispensed with. Such would be the case, for example, if the terminals 6 and 7 of the secondary winding W2 were interchanged or the voltage taken off at the tap 9 of the voltage divider R5, R6 was fed to the non-inverting input of the amplifier V3.

If the secondary winding W2 of the transformer is under load, i.e., is connected to a load impedance $Z_L$ and a current measuring resistor $R_M$, a more complex error occurs in the desired ac voltage as it appears at the terminal 7. This error will be described in detail with the aid of FIG. 2. More particularly the latter figure shows an equivalent circuit diagram of the power amplifier V2, the transformer W, the load impedance $Z_L$ and the current measuring resistor $R_M$. The amplifier V2 includes a voltage source $U_i$ and an output resistance $R_i$. The transformer W comprises a total winding resistance $R_w$ and a stray inductance $L_s$ both having been referred to the primary side of the transformer. The stray inductance of the transformer, thus, has a reactance at a nominal frequency w or $wL_s$ or $X_s$. The output current $I_L$ of the amplifier V2 flows through the load impedance $Z'_L$ and the current measuring resistor $R'_M$, both also have been referred to the primary side of the transformer. The current, hence, results in a voltage drop $U_A$ across the series circuit comprising the impedance $Z'_L$ and resistor $R'_M$.

Figure 2:
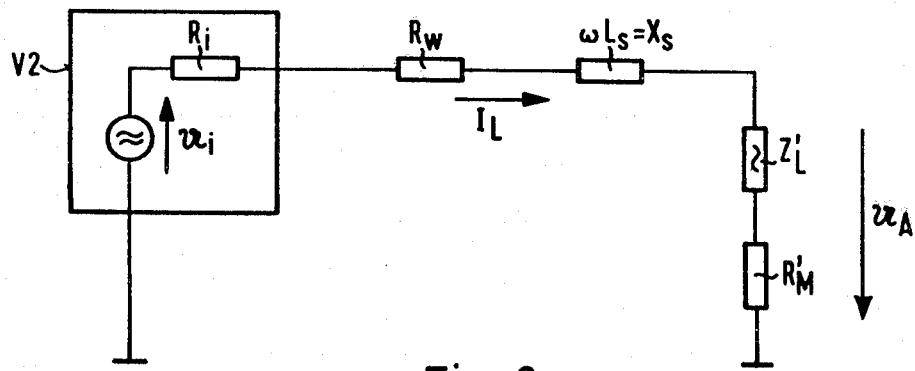
FIG. 2 illustrates, for explanation purposes, an equivalent circuit of a portion of the circuit of FIG. 1.
Figure 3:
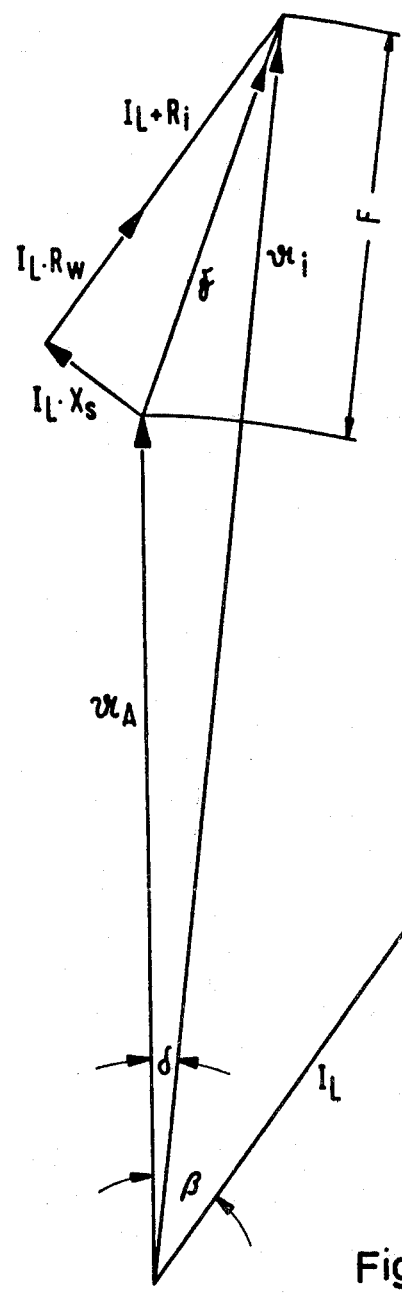
FIG. 3 illustrates, also for explanation purposes, a vector diagram of the voltages appearing in the circuit of FIG. 1.

The vector diagram shown in FIG. 3 illustrates the voltages appearing in the equivalent circuit of FIG. 2 and, hence, the corresponding circuit arrangement of FIG. 1. As can be observed, the output current $I_L$ of the amplifier V2 lags the voltage $U_A$ by the angle $\beta$. The output voltage $U_A$ also differs from the voltage $U_i$ of the equivalent voltage source of the power amplifier V2 by an error voltage which is composed of the transmission errors of the transformer, $I_L \times X_s$ and $I_L \times R_w$, as well as an error $I_L \times R_i$ caused by the finite output resistance of the power amplifier. The amplitude of this error voltage is F and the angle error $\delta$.

For compensating for the errors F and $\delta$ illustrated in FIG. 3 and appearing in the voltage $U_A$, the circuit arrangement of FIG. 1 is provided with a tap 8 between the resistor $R_M$ and the load impedance $Z_L$ for deriving the voltage across the resistor. This voltage has an amplitude which is proportional to the current flowing through the load impedance and a phase which is equal to the phase of such current. It is fed from the junction point 8 via a resistor R8 to the inverting input of an amplifier V4. The amplifier V4 is further provided with feedback via a resistor R9 and the gain of the amplifier is thus determined by the resistors R8 and R9. The output of the amplifier V4 is connected to an inverter I3 whose output is applied to the input 12 of the summing circuit and comprises a voltage which is in phase with the voltage appearing at the junction point 8 and, therefore, also with the current flowing through the load impedance $Z_L$. This voltage is fed via the resistor R13 to the inverting input 2 of the power amplifier V2.

It should be pointed out that the output of the amplifier V4 need not be passed through the inverter I3 if the voltage at the junction point 8 is fed, via the resistor R8, to the non-inverting input rather than the inverting input of the amplifier V4. In such case, the end of the resistor R8 connected to the junction point 8 must be grounded. Moverover, if the voltage appearing at the input 12 of the summing circuit is smaller than the voltage drop across the measuring resistance $R_M$, then the amplifier V4 can be replaced by a passive voltage divider.

The voltage appearing at the junction point 8 is further fed via a resistor R10 to an amplifier V5 and is phase shifted by 90° in the latter due to the negative feedback provided thereto by the capacitor C4. This phase shifted voltage is applied to an inverter I2 whose output in applied to the input 11 of the summing circuit. A voltage, thus, appears at the input 11 which is phase shifted by 90° relative to the voltage which appears at the junction point 8. This voltage, in turn, is coupled to the input 2 of the power amplifier V2 via the variable resistor R12.

Again, it should be noted that output of the amplifier V5 need not be passed through the inverter I2 if the voltage appearing at the measuring resistor $R_M$ is fed to the non-inverting rather than the inverting input of the amplifier V5. Also, if the voltage appearing at the input 11 is smaller than that appearing at the junction point 8, then the amplifier V5 can be replaced by a passive phase shifting member.

Figure 4:
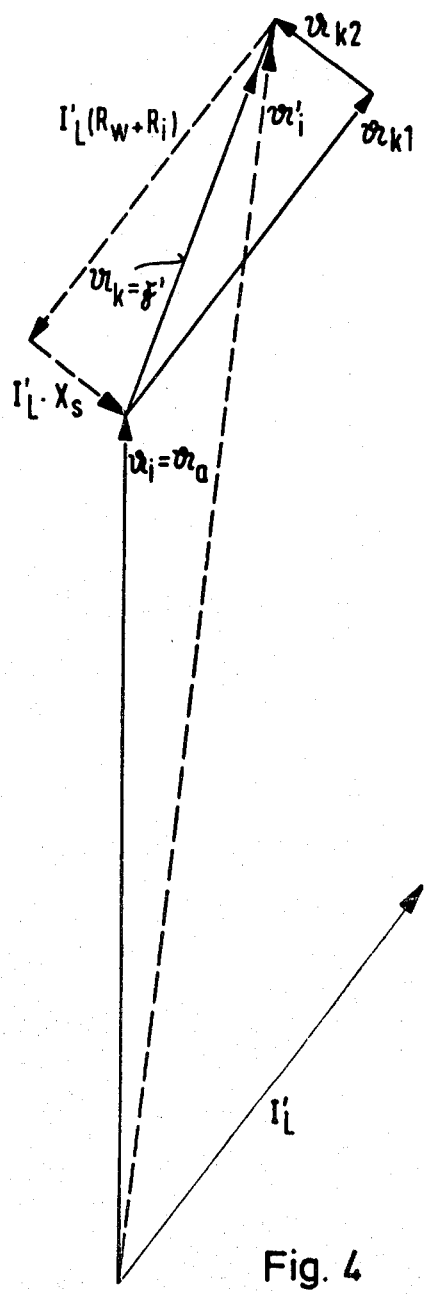
FIG. 4 shows, also for explanation purposes, a vector diagram of the voltages of the circuit of FIG. 1 with the circuit operating to provide compensation.

The operation of the arrangement of FIG. 1 to provide compensation in the presence of the impedance $Z_L$ is illustrated in FIG. 4. The voltage $U'_i$ of the equivalent voltage source of the power amplifier V2 comprises the desired ac voltage $U_i$ as it appears at the preamplifier output and, hence, the input 13 and a compensation voltage $U_K$ resulting from the voltages at the inputs 11 and 12. Thus, the output current $I'_L$ of the amplifier V2 generates at the winding resistance $R_w$ of the transformer and the output resistance $R_i$ of the power amplifier V2, referred to the primary side of the transformer, a voltage drop $I'_L(R_w+R_i)$. Additionally, at the reactance $X_s$ of the stray inductance of the transformer, also referred to the primary side of the transformer, the current generates a further voltage drop $I'_L.X_s$. The sum of these two voltages again yields an error voltage F′.

The compensation voltage $U_k$ is selected so that its amplitude and phase are equal and opposite to the amplitude and phase respectively of the error voltage F′. The output voltage $U_A$ across the series circuit comprising the load impedance $Z'_L$ referred to the primary side of the transformer and the current measuring resistance $R'_M$ referred to the primary side is, therefore, equal to the desired ac voltage $U_i$.

The compensation voltage $U_k$ is comprised of a voltage $U_{k1}$ delivered by the inverter I3 to the input 12 of the summing circuit. The voltage $U_{k1}$ is set by the summing resistor R13 in such a manner that it is equal to the voltage $I'_L(R_w+R_i)$, i.e., to the portion of the error voltage F′ caused by ohmic resistances. This voltage, too, is in phase with the load current $I'_L$. The voltage $U_K$ is further comprised of a voltage $U_{k2}$ which is delivered by the inverter I2 to the input 11. The voltage $U_{k2}$ is phase shifted by 90° relative to the load current $I'_L$ and by 180° relative to the voltage $I'_L.X_s$. Furthermore, its amplitude is adjusted by means of the resistor R12 so that it is equal to the amplitude of the voltage $I'_L.X_s$.

From the above, it can, thus, be appreciated that with the present circuit arrangement, it is possible to achieve substantially complete cancellation of the errors introduced by the transformer W under load and no load conditions to a desired ac voltage.

In the illustrative embodiment of the invention described above variable resistors were employed for the resistors R11, R12 and R13. It should be noted, however, that fixed resistors could also be employed for the latter three resistors, if amplifiers having variable gains were employed for the amplifiers V3, V4 and V5. Also in the aforesaid illustrative embodiment, integrating components are used for phase-shifting. These components have a frequency-dependent transfer behavior, i.e., high frequencies are suppressed and low ones amplified. With higher frequencies, particularly dc voltage can be taken into account by further including in the circuit a further device designed to provide suppression of dc voltage. In such case, a unit N which is connected between the tap 9 of the voltage divider R5, R6 and the inverting input 2 of the amplifier V2 may be employed to compensate for possible null voltages.

Moreover, in place of integrators, the circuit arrangement may be provided with differentiators which themselves attenuate low frequencies and which have more gain at higher frequencies than at the nominal frequency. Differentiators, however, in some cases can lead to overcompensation of the errors.

If transformer errors are to be compensated over an extended frequency range, it is advisable to use phase shifters which comprise a combination of proportional, integrating and differentiating means.

What is claimed is:

1. A circuit arrangement for compensating for the transmission errors occurring in a desired signal as a result of passage of said desired signal through a transformer, said transformer having a primary winding and secondary winding, said secondary winding being adapted to be connected to a load impedance, said circuit arrangement comprising:

phase shift means adapted to be responsive to the output of said secondary winding for generating a compensating signal having a phase and amplitude adjusted so as to result in the substantial cancellation of the transmission errors occurring in said desired signal when combined with said desired signal and passed therewith through said transformer;

combining means for combining said compensating signal and said desired signal for application to said primary winding of said transformer;

first means responsive to the output of said secondary winding applied to said load impedance for generating a signal which is in phase with the current flowing through said load impedance and whose amplitude is proportional to the amplitude of said current; and second means for coupling the signal generated by said first means to said phase shift means.

2. A circuit arrangement in accordance with claim 1 wherein:
said phase shift means includes a phase shifter having an adjustable phase shift.

3. A circuit arrangement in accordance with claim 1 wherein:
said phase shifter has an output to input signal ratio which is adjustable.

4. A circuit arrangement in accordance with claim 1 wherein:
said combining means comprises a summing circuit, said summing circuit having inputs for receiving said desired signal and said compensating signal, a summing point at which said desired and compensating signals are summed, and an output coupling the sum signal to said primary winding.

5. A circuit arrangement in accordance with claim 4 wherein:
said summing circuit includes a power amplifier having an output adapted to be connected to said primary winding; and
said compensating signal has a phase and amplitude adjusted so as to result in substantial cancellation of the transmission errors occurring in said desired signal as a result of passage through said power amplifier and said transformer when summed with said desired signal at said summing point.

6. A circuit arrangement in accordance with claim 1 wherein:
said means responsive to said output comprises a resistor adapted to be connected in series with said load impedance.

7. Apparatus in accordance with claim 1 wherein said phase shift means includes:
a first amplifier arrangement responsive to the signal generated by said first means, said first amplifier arrangement having an adjustable gain and causing substantially zero phase shift to signals passing therethrough; and
a second amplifier arrangment responsive to the signal generated by said first means, said means amplifier arrangement having an adjustable gain and causing a 90° phase shift to signals passing therethrough;
the outputs of said first and second amplifiers being coupled to said combining means.

8. A circuit arrangement in accordance with claim 7 wherein:
said phase shift means further includes:
a third amplifier arrangement having an input adapted to be connected to said secondary winding, an adjustable gain, and causing a 90° phase shift to signals passing therethrough;
the output of said third amplifier arrangement being coupled to said combining means.

* * * * *